US012282232B2

(12) United States Patent
Zhang et al.

(10) Patent No.: US 12,282,232 B2
(45) Date of Patent: Apr. 22, 2025

(54) DISPLAY PANEL AND DISPLAY DEVICE

(71) Applicants: BEIJING BOE DISPLAY TECHNOLOGY CO., LTD., Beijing (CN); BOE Technology Group Co., Ltd., Beijing (CN)

(72) Inventors: Jiliang Zhang, Beijing (CN); Zhiqiang Ma, Beijing (CN); Xiaona Liu, Beijing (CN); Zhitao Li, Beijing (CN); Yu Ma, Beijing (CN); Weitao Chen, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/022,906

(22) PCT Filed: Apr. 26, 2022

(86) PCT No.: PCT/CN2022/089269
§ 371 (c)(1),
(2) Date: Feb. 23, 2023

(87) PCT Pub. No.: WO2023/206072
PCT Pub. Date: Nov. 2, 2023

(65) Prior Publication Data
US 2024/0272489 A1 Aug. 15, 2024

(51) Int. Cl.
*G02F 1/1339* (2006.01)
*G02F 1/133* (2006.01)
(Continued)

(52) U.S. Cl.
CPC ...... *G02F 1/13398* (2021.01); *G02F 1/13306* (2013.01); *G02F 1/133512* (2013.01);
(Continued)

(58) Field of Classification Search
CPC ............ G02F 1/13398; G02F 1/13396; G02F 1/13394; G02F 1/1339; G02F 1/13306;
(Continued)

(56) References Cited

U.S. PATENT DOCUMENTS

2022/0334424 A1 10/2022 Chen et al.

FOREIGN PATENT DOCUMENTS

| CN | 107632442 A | 1/2018 |
| CN | 109856849 A | 6/2019 |

(Continued)

OTHER PUBLICATIONS

English language translation of Chinese Patent Application No. CN110515243 published Nov. 29, 2019. Original and translation downloaded from Espacenet. (Year: 2019).*

*Primary Examiner* — Angela M. Medich
(74) *Attorney, Agent, or Firm* — WHDA, LLP

(57) ABSTRACT

A display panel and a display device are provided, and relate to the field of displaying. The display panel includes a display area and a peripheral area located at a periphery of the display area. The peripheral area includes a package region and an UDC region located between the display area and the package region. The display panel further includes a transition area surrounding the UDC region, and an opposite substrate and an array substrate arranged opposite to each other. In the UDC region, the opposite substrate and the array substrate are both light-transmissible areas; in the transition area, at least one spacer ring surrounding the UDC region is arranged on the opposite substrate, and each spacer ring includes a plurality of spacers that are spaced apart from each other. The technical solutions of the present disclosure can implement UDCs for the medium-sized display product and the large-sized display product.

19 Claims, 5 Drawing Sheets

(51) Int. Cl.
  *G02F 1/1335*   (2006.01)
  *G02F 1/1362*   (2006.01)
  *H10D 86/40*    (2025.01)
  *H10D 86/60*    (2025.01)
  *H10D 89/60*    (2025.01)

(52) U.S. Cl.
  CPC .... *G02F 1/133514* (2013.01); *G02F 1/13394* (2013.01); *G02F 1/136286* (2013.01); *H10D 86/441* (2025.01); *H10D 86/60* (2025.01); *H10D 89/60* (2025.01); *G02F 2202/22* (2013.01)

(58) Field of Classification Search
  CPC ........... G02F 1/136286; G02F 1/13312; G02F 1/13318; H04M 1/0264; H04M 1/0266
  See application file for complete search history.

(56) References Cited

FOREIGN PATENT DOCUMENTS

| | | | |
|---|---|---|---|
| CN | 110187559 | A | 8/2019 |
| CN | 110515243 | A | 11/2019 |
| CN | 110703510 | A | 1/2020 |
| CN | 111983840 | A | 11/2020 |
| CN | 113467121 | A | 10/2021 |

\* cited by examiner

DISPLAY PANEL AND DISPLAY DEVICE

CROSS-REFERENCE TO RELATED APPLICATION

The present application is the U.S. national phase of PCT Application No. PCT/CN2022/089269 filed on Apr. 26, 2022, which is incorporated herein by reference in its entirety.

TECHNICAL FIELD

The present disclosure relates to the field of display technology, in particular to a display panel and a display device.

BACKGROUND

To meet the user's demand for a display product with a large screen-to-body ratio, the display panel is developing in the direction of full screen. In prior art, a small-sized display product is provided with an Under Display Camera (UDC) by punching a hole in a display area, and each of a medium-sized product and a large-sized display product is always provided with an external independent camera.

SUMMARY

An object of the present disclosure is to provide a display panel and a display device, which can implement UDCs for the medium-sized display product and the large-sized display product.

To solve the above technical problems, the embodiments of the present disclosure provide the following technical solutions.

In one aspect, the present disclosure provides display panel, including a display area and a peripheral area located at a periphery of the display area, wherein the peripheral area includes a package region and an Under Display Camera (UDC) region, the UDC region is located between the display area and the package region, wherein the display panel further includes a transition area, an opposite substrate and an array substrate, the transition area surrounds the UDC region, and the opposite substrate and the array substrate are arranged opposite to each other;
  in the UDC region, the opposite substrate and the array substrate are both light-transmissible areas;
  in the transition area, at least one spacer ring surrounding the UDC region is arranged on the opposite substrate, and each of the at least one spacer ring includes a plurality of spacers that are spaced apart from each other.

In some embodiments, the transition area includes a first transition region that is immediately adjacent to the UDC region and surrounds the UDC region; in the first transition region, the opposite substrate includes a first base substrate, a black matrix located on the first base substrate, and at least one first spacer ring located on a side of the black matrix distal to the first base substrate;
  each of the at least one first spacer ring includes a plurality of first spacers that are spaced apart from each other, and the first spacers are arranged around the UDC region.

In some embodiments, the transition area further includes a second transition region that is located on a side of the first transition region distal to the UDC region and surrounds the UDC region; in the second transition region, the opposite substrate includes a first base substrate, a black matrix located on the first base substrate, a color filter pattern located on a side of the black matrix distal to the first base substrate, and at least one second spacer ring located on a side of the color filter pattern distal to the first base substrate;
  each of the at least one second spacer ring includes a plurality of second spacers that are spaced apart from each other, and the second spacers are arranged around the UDC region.

In some embodiments, a height of the first spacer is greater than that of the second spacer.

In some embodiments, a height difference between the first spacer and the second spacer is 0.4-0.5 μm.

In some embodiments, a minimum distance between an end of the second spacer distal to the first base substrate and the array substrate is smaller than a minimum distance between an end of the first spacer distal to the first base substrate and the array substrate.

In some embodiments, a spacing between two adjacent spacers in each spacer ring is 6-7 μm.

In some embodiments, in the peripheral area, the array substrate includes a second base substrate and a driving circuit located on the second base substrate, the driving circuit is located out of the UDC region, and the driving circuit includes at least one of: a power supply voltage signal line, a first common voltage signal line, a grounding signal line, and a static-electricity-discharging circuit array.

In some embodiments, the driving circuit includes the static-electricity-discharging circuit array, and an extension direction of a boundary of the static-electricity-discharging circuit array adjacent to the UDC region is same as or approximately same as an extension direction of a boundary of the UDC region adjacent to the static-electricity-discharging circuit array.

In some embodiments, the driving circuit includes the first common voltage signal line, the display panel further includes a second common voltage signal line located in the display area, and the display panel further includes:
  a connection pattern, wherein the connection pattern is connected to the first common voltage signal line through a plurality of connection points, and connected to the second common voltage signal line through a plurality of connection points.

In some embodiments, the display panel further includes a data line located in the display area, and an orthographic projection of the connection pattern onto the second base substrate does not overlap an orthographic projection of the data line onto the second base substrate.

The embodiments of the present disclosure provide a display device including the display panel as described above.

In some embodiments, the display device further includes a polarizer attached to a surface of the display panel, and an orthographic projection of the polarizer onto the display panel does not overlap the UDC region.

In some embodiments, the polarizer includes an aperture, and a first boundary of an orthographic projection of the aperture onto the display panel surrounds the UDC region.

In some embodiments, a minimum distance between the first boundary and a second boundary of the UDC region is greater than 2 μm.

In some embodiments, an edge of the polarizer includes an indentation, a boundary of an orthographic projection of the indentation onto the display panel surrounds the UDC region.

In some embodiments, the indentation is of a trapezium.

The embodiments of the present disclosure have the following beneficial effects:

in the above-mentioned solutions, in the UDC region, the opposite substrate and the array substrate are both light-transmissible areas, which can implement a high transmittance of the UDC region, and ensure that the UDC can collect sufficient light. In addition, in the transition area, at least one spacer ring surrounding the UDC region is arranged on the opposite substrate, and each spacer ring includes a plurality of spacers that are spaced apart from each other. The spacers in the transition area can ensure the uniformity of the thickness of the cell in the UDC region, prevent the yellowing phenomenon caused by the uneven thickness of the cell in the UDC region, to implement the UDCs for the medium-sized display product and the large-sized display product.

REFERENCE NUMBERS

Figure 1:
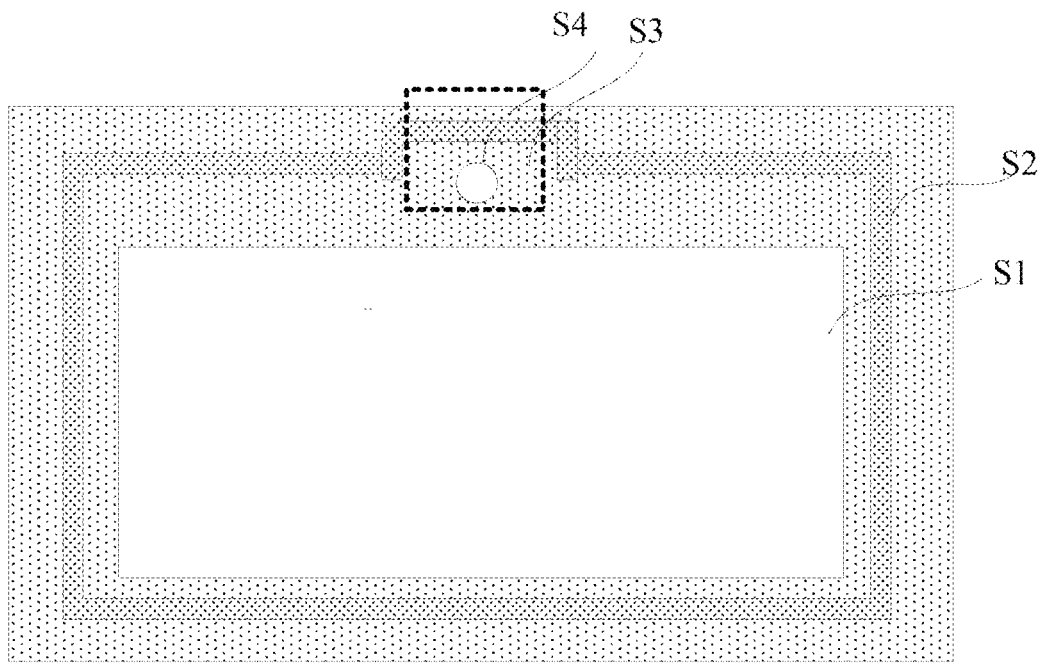
FIG. 1 is a schematic plan view of a display panel according to an embodiment of the present disclosure.

S1 Display area
S2 Package region
S3 Peripheral area
S4 UDC region
S6 First transition region
S7 Second transition region
1 Display panel
01 Color filter pattern
02 Black matrix
031 First spacer
032 Second spacer
04 Grounding signal line
05 First common voltage signal line
06 Power supply voltage signal line
08 Static-electricity-discharging circuit array
09 Virtual pixel
10 Polarizer
11 Data line
12 Connection pattern
13 Second common voltage signal line
14 Common electrode
15 Via hole
16 Gate line
21 Second base substrate
22 Gate insulation layer
23 Passivation layer
24 Alignment layer
25 First base substrate
26 Planarization layer
27 Liquid crystal layer
101 Aperture
102 Indentation

DETAILED DESCRIPTION

To make the technical problems, technical solutions and advantages of the embodiments of the present disclosure clearer, the following will be described in detail with reference to the drawings and specific embodiments.

The embodiments of the present disclosure provide a display panel and a display device, which can implement UDCs for the medium-sized display product and the large-sized display product.

As shown in FIG. 1, an embodiment of the present disclosure provides a display panel, including a display area S1 and a peripheral area S3 located at the periphery of the display area S1. The peripheral area S3 includes a package region S2 and an UDC region S4 located between the display area S2 and the package region S2. The display panel further includes a transition area surrounding the UDC region S4, an opposite substrate, and an array substrate which are arranged opposite to each other;

in the UDC region, the opposite substrate and the array substrate are both light-transmissible areas;

in the transition area, at least one spacer ring surrounding the UDC region is arranged on the opposite substrate, and each spacer ring includes a plurality of spacers that are spaced apart from each other.

In the present embodiment, in the UDC region, the opposite substrate and the array substrate are both light-transmissible areas, which can implement a high transmittance of the UDC region, and ensure that the UDC can collect sufficient light. In addition, in the transition area, at least one spacer ring surrounding the UDC region is arranged on the opposite substrate, and each spacer ring includes a plurality of spacers that are spaced apart from each other. The spacers in the transition area can ensure the uniformity of the thickness of the cell in the UDC region, and prevent the yellowing phenomenon caused by the uneven thickness of the cell in the UDC region, to implement the arrangement of the UDC for the medium-sized display product and the large-sized display product.

Figure 4:
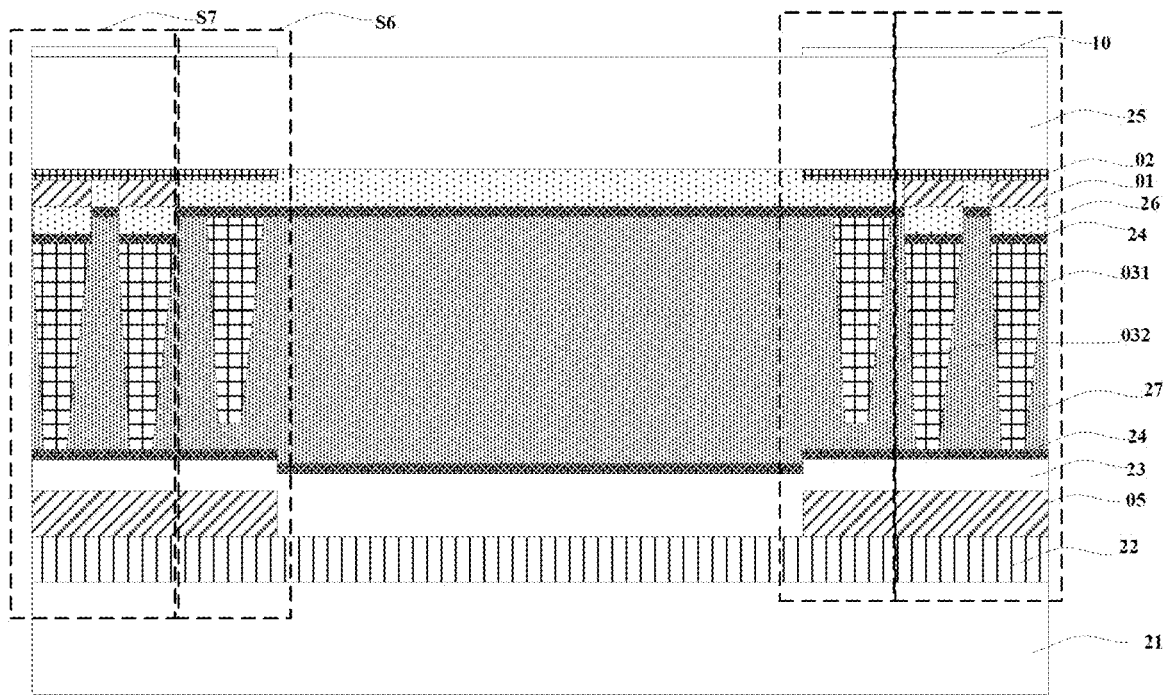
FIG. 4 is a schematic cross-sectional view of FIG. 3 in the direction AA.

The liquid crystal display panel includes an opposite substrate and an array substrate which are arranged opposite to each other, and as shown in FIG. 4, the opposite substrate includes a first base substrate 25, a color filter layer and a black matrix 02 located on the first base substrate, a planarization layer 26 located on the black matrix, an alignment layer 24 located on the planarization layer 26, spacers, and the like sequentially in that order; the array substrate includes a second base substrate 21, a gate insulation layer 22, a gate metal layer, an interlayer insulation layer, a source/drain metal layer, a passivation layer 23 and alignment layers 24 located on the second base substrate 21; a liquid crystal layer 27 is arranged between the two alignment layers 24. The black matrix and the color filter layer may not be arranged on the opposite substrate and the metal film layer may not be arranged on the array substrate in the UDC region, to implement that the UDC region is a light-transmissible area and can transmit white light, ensuring that the UDC can collect sufficient light.

For a small-sized display product, the size of the UDC is relatively small, and the UDC can be arranged by directly punching a hole in the display area; for the medium-sized display product and the large-sized display product, the size of an UDC is relatively large; the arrangement of the UDC by punching the hole in the display area would have a relatively obvious effect on the display; the UDC region needs to be arranged in the peripheral area; and opaque film layers (including a gate metal layer and a source/drain metal layer) on an array substrate and an opposite substrate in the UDC region are removed to implement a high transmittance of the UDC region, to ensure that the UDC can collect sufficient light. In addition, to ensure a high transmittance, no spacer is arranged in the UDC region, because it may adversely affect the uniformity of the thickness of the cell in the UDC region, and cause a yellowing phenomenon to occur in the UDC region, thus adversely affecting the display quality. In the embodiment, at least one spacer ring is arranged in the transition area surrounding the UDC region S4, to support the thickness of the cell, ensure the uniformity of the thickness of the cell in the UDC region, and avoid the yellowing phenomenon caused by the uneven thickness of the cell in the UDC region, to implement the arrangement of the UDC in each of the medium-sized display product and the large-sized display product.

In this embodiment, the shape of the UDC region matches the shape of the UDC, and can be a circle or a square; the size of the UDC region matches the size of the UDC; and the size of the UDC region can be slightly larger than the size of the UDC. When the UDC region is of a circle, the diameter of the UDC region may be less than or equal to 4 mm, so as to prevent from adversely affecting the appearance of the display panel.

Figure 2:
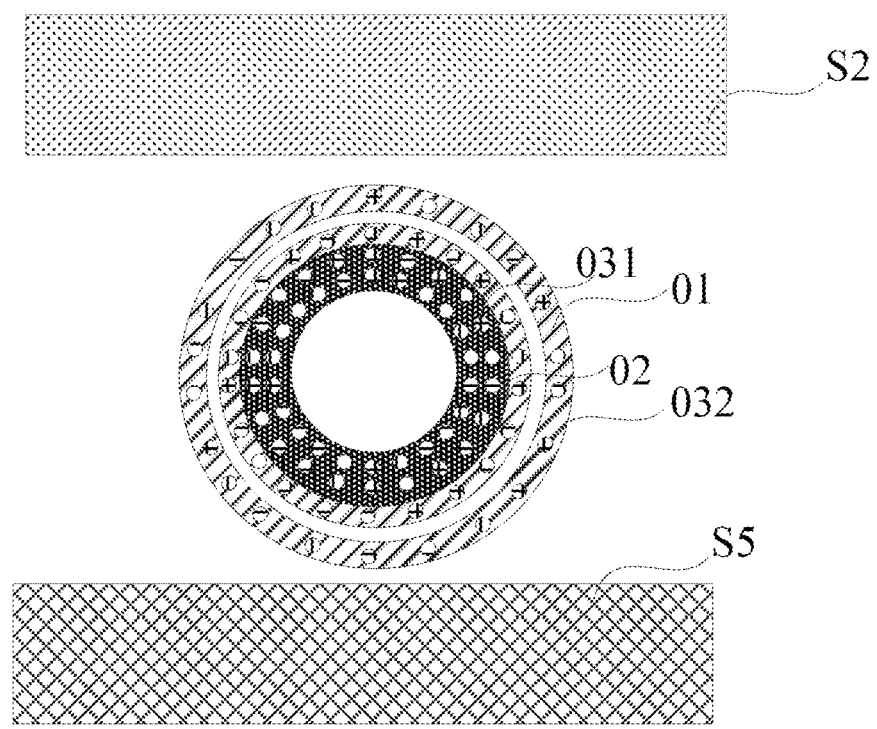
FIGS. 2 and 3 are schematic plan views of an UDC region according to an embodiment of the present disclosure.
Figure 3:
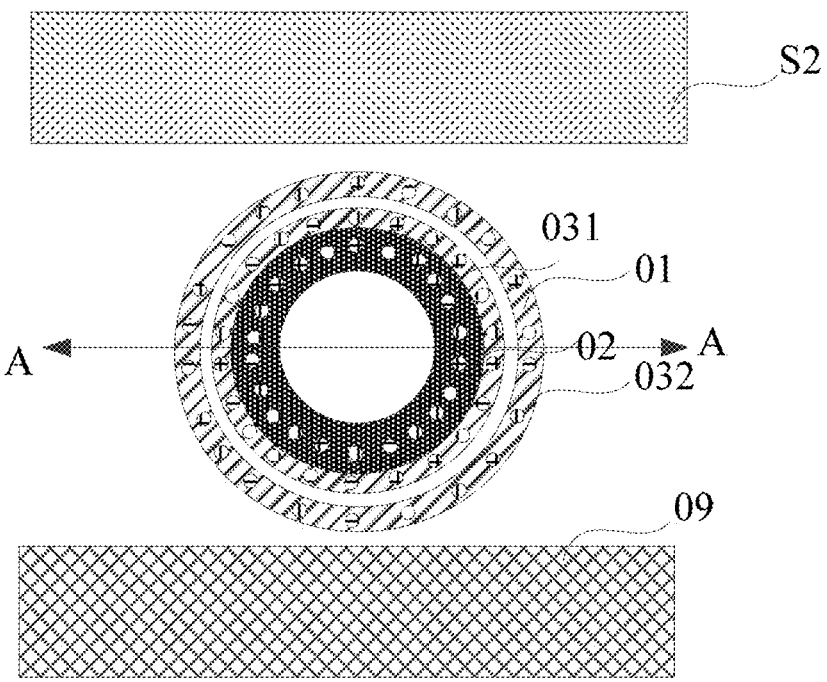

FIGS. 2 and 3 are schematic plan views of an UDC region according to an embodiment of the present disclosure; FIG. 4 is a schematic cross-sectional view of FIG. 3 in the direction AA; as shown in FIGS. 2-4, a plurality of spacer rings (including a first spacer 031 and a second spacer 032) are arranged at a transition area around the UDC region. In order to implement a smooth transition around the UDC region, the transition area is divided into a first transition region and a second transition region, where the first transition region is adjacent to and surrounds the UDC region; a second transition region is located at a side of the first transition region distal to the UDC region and surrounds the UDC region.

As shown in FIGS. 2-4, in the first transition region S6, the opposite substrate includes a first base substrate 25, and a black matrix 02, a planarization layer 26, an alignment layer 24, and at least one ring of the first spacers 031 (i.e., at least one first spacer ring) located on the first base substrate 25, wherein the at least one ring of the first spacers 031 is located on a side of the black matrix 02 distal to the first base substrate 25; in the first transition region S6, each of the at least one ring of the first spacers 031 includes a plurality of the first spacers 031 that are spaced apart from each other, and the first spacers 031 are arranged around the UDC region S4. As shown in FIG. 2, two rings of the first spacers 031 (i.e., two first spacer rings) may be arranged, or one ring of the first spacer rings 031 may be arranged as shown in FIG. 3. In the first transition region S6, the first spacer 031 can support the thickness of the cell in the UDC region S4, ensure the uniformity of the thickness of the cell in the UDC region, and prevent the yellowing phenomenon caused by the uneven thickness of the cell in the UDC region.

To implement the transition from the first transition region S6 to the peripheral area, the transition area also includes a second transition region S7. As shown in FIGS. 2-4, in the second transition region S7, the opposite substrate includes a first base substrate 25, a black matrix 02 located on the first base substrate 25, and a color filter pattern 01, a planarization layer 26, alignment layers 24 and at least one ring of the second spacer 032 (i.e., at least one second spacer ring) located on the black matrix 02, wherein the at least one ring of the second spacer 032 is located on a side of the color filter pattern 01 distal to the first base substrate 25; in the second transition region S7, each of the at least one ring of the second spacers 032 includes a plurality of second spacers 032 that are spaced apart from each other, and the second spacers 032 are arranged around the UDC region S4. As shown in FIGS. 2 and 3, two rings of second spacers 032 (i.e., at least two second spacer rings) may be arranged, or multiple rings of second spacers 032 (i.e., multiple second spacer rings) may be arranged. In the second transition region S7, the second spacers 032 can further support the thickness of the cell in the UDC region S4, ensure the uniformity of the thickness of the cell in the UDC region, and avoid the yellowing phenomenon caused by the uneven thickness of the cell in the UDC region.

Since the color filter pattern 01 is not arranged in the first transition region S6, and the color filter pattern 01 is arranged in the second transition region S7, the height of the first spacer 031 can be designed to be greater than the height of the second spacer 032, to ensure that the thickness of the cell in the first transition region S6 is consistent with the thickness of the cell in the second transition region S7, and the height difference between the first spacer 031 and the second spacer 032 can be 0.4-0.5 μm. In this embodiment, the shape of the transition area matches the shape of the UDC region, and can be a circular ring or a square ring; when the UDC region is of the circle, the transition area is of the circular ring, the inner diameter of the transition area can be equal to or slightly greater than the radius of the UDC region, and the difference between the outer diameter and the inner diameter can be in a range from 0.6 mm to 0.8 mm. The difference between the outer diameter and the inner diameter of the first transition region may be in a range from 0.2 mm to 0.4 mm; the density of the first spacer may be that a respective one first spacer 031 is arranged with respect to the range of each pixel area; and in each first spacer ring, the spacing between two adjacent first spacers may be 6-7 μm. The difference between the outer diameter and the inner diameter of the second transition region may be from 0.4 mm to 0.6 mm; the density of the second spacer may be that a respective second spacer 032 is arranged with respect to the range of each pixel area; and in each second spacer ring, the spacing between two adjacent second spacers may be 6-7 μm. The color filter pattern 01 may be of a circle with a diameter of 40-100 μm, and the orthographic projection of the second spacer 032 onto the first base substrate 25 may be located within the orthographic projection of the color filter pattern 01 onto the first base substrate 25.

In some embodiments, a minimum distance between an end of the second spacer 032 distal to the first base substrate and the array substrate is smaller than a minimum distance between an end of the first spacer 031 distal to the first base substrate and the array substrate, so that the supporting heights of the spacers increase successively from the center outwards the edge of the UDC region, so that a transition can be formed, and the risk of "see-saw" is prevented.

The display area of the display panel is provided with a main spacer and an auxiliary spacer, the height of the main spacer is greater than that of the auxiliary spacer, and the height of the first spacer can be consistent with that of the main spacer in the display area; the height of the second spacer can be consistent with that of the auxiliary spacer in the display area. In the display area, since the thickness of the blue filtering unit is relatively uniform, the spacers are all arranged at the side of the blue filtering unit distal to the first base substrate; and in the transition area, both the first spacer and the second spacer can be arranged at the side of the blue filtering unit distal to the first base substrate.

Figure 5:
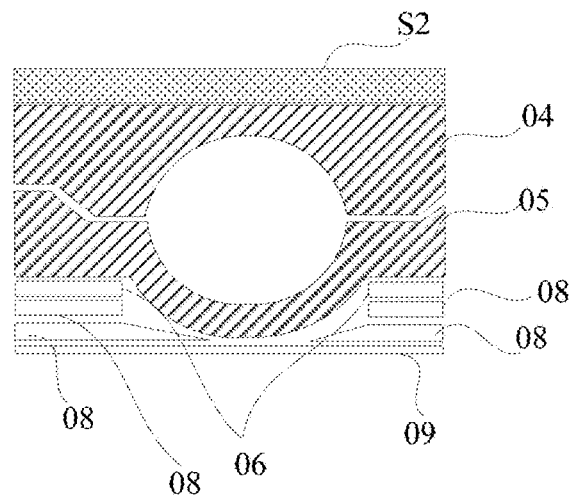
FIG. 5 is a schematic plan view of the UDC region of a display substrate according to an embodiment of the present disclosure.

In order to implement a camera function, it needs to ensure that the light of the UDC region S4 cannot be blocked by metal, and therefore the metal layer on the array substrate needs to be specially designed. In the peripheral area, the array substrate includes a second base substrate and a driving circuit located on the second base substrate; as shown in FIG. 5, the driving circuit is located out of the UDC region S4, and the driving circuit includes at least one of: a power supply voltage signal line 06, a first common voltage signal line 05, a grounding signal line 04, and a static-electricity-discharging circuit array 08. The driving circuit is out of the UDC region S4, that is, the orthographic projection of the driving circuit onto the second base substrate 21 does not overlap the UDC region S4.

In the peripheral area, the line width of the grounding signal line 04 adjacent to the UDC region S4 should be correspondingly reduced to enable that a transmittance of the UDC region S4 is greater than or equal to 90%. In the peripheral area, the line width of the first common voltage signal line 05 adjacent to the UDC region S4 should be correspondingly reduced to enable that a transmittance of the UDC region S4 is greater than or equal to 90%. In the peripheral area, the line width of the power supply voltage signal line 06 adjacent to the UDC region S4 should be correspondingly reduced to enable that a transmittance of the UDC region S4 is greater than or equal to 90%.

In the peripheral area, the size of the static-electricity-discharging circuit array 08 should be reduced to enable that a transmittance of the UDC region S4 is greater than or equal to 90%. In the row direction, a length of the static-electricity-discharging circuit array 08 should be within a range from 1 mm to 4 mm. As shown in FIG. 5, an extension direction of the static-electricity-discharging circuit array 08 adjacent to the boundary of the UDC region is the same as or approximately the same as an extension direction of a boundary of the UDC region adjacent to the static-electricity-discharging circuit array 08. Therefore, it can effectively utilize the blank area around the camera module and reduce the difference between the blank area and other areas of the display panel.

In addition, in the peripheral area, the number of virtual pixels 09 needs to be reduced to enable that a transmittance of the UDC region S4 is greater than or equal to 90%. The number of virtual pixels 09 to be reduced can be determined according to the size of the UDC region S4, and the minimum number of virtual pixels 09 can be reduced to 0.

As shown in FIG. 4, in the UDC region S4, the array substrate only includes a second base substrate 21, a gate insulation layer 22, a passivation layer 23, and alignment layers 24; in the first transition region S6 and the second transition region S7, the array substrate includes the second base substrate 21, the first common voltage signal line 05, the gate insulation layer 22, the passivation layer 23 and the alignment layers 24; and the first common voltage signal line 05 cooperates with the spacers to support the thickness of the cell of the UDC region S4. In this embodiment, the grounding signal line 04, the first common voltage signal line 05, and the spacers cooperate with each other to support the thickness of the cell of the UDC region S4; or as shown in FIG. 4, only the first common voltage signal line 05 cooperates with the spacers to support the thickness of the cell of the UDC region S4, while the grounding signal line 04 may be completely covered by the packaging adhesive.

Figure 6:
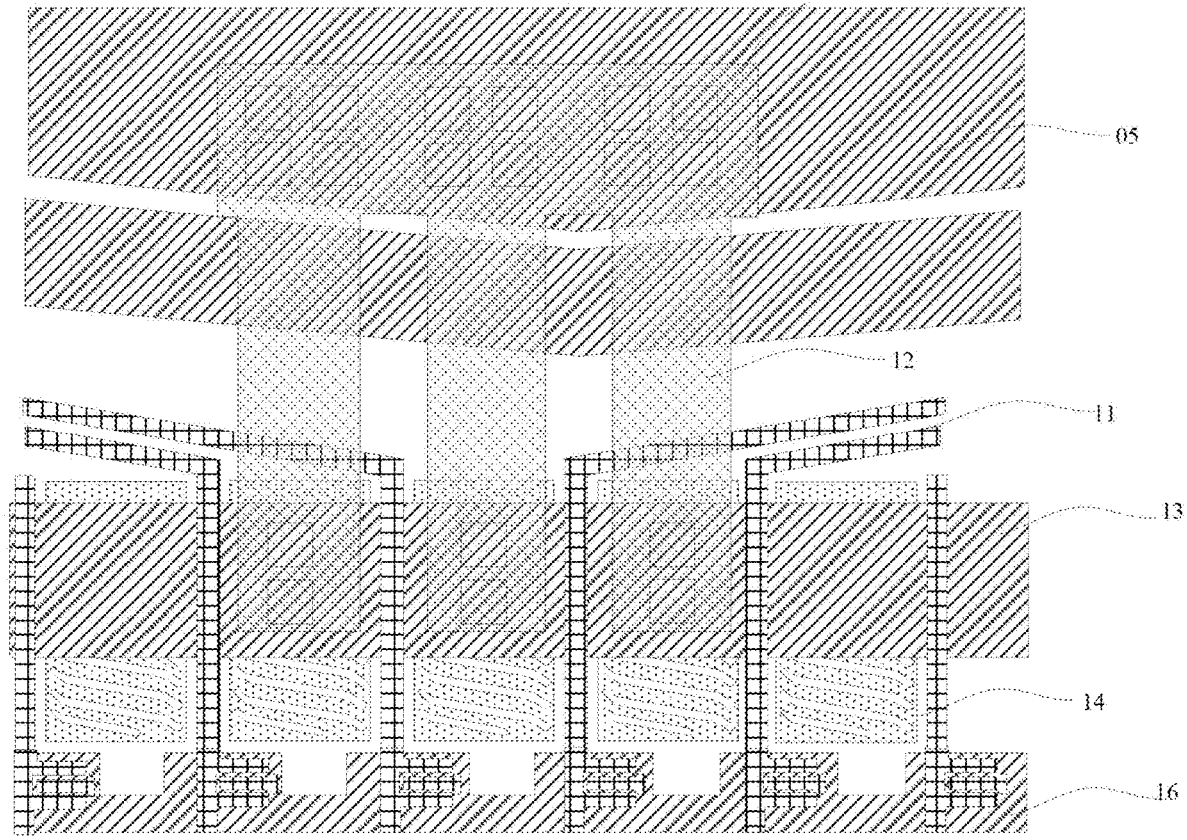
FIG. 6 is a schematic view of connecting a common electrode and a common voltage signal line through multiple points according to an embodiment of the present disclosure.

As shown in FIG. 6, the display panel further includes a second common voltage signal line 13 located in the display area; a gate line 16, a data line 11, and a common electrode 14 are arranged in the display area; the common voltage signal is transmitted to the second common voltage signal line 13 via the first common voltage signal line 05 and then transmitted to the common electrode 14. In order to improve the uniformity of the common voltage, the common voltage signal can be provided to the display area through multiple points. As shown in FIG. 6, the display panel further includes: the connection pattern 12 connected to the first common voltage signal line 05 through a plurality of connection points, and connected to the second common voltage signal line 13 through a plurality of connection points, so that the provision of the common voltage signal to the display area through multiple points can be implemented using the connection pattern 12. The connection pattern 12 can be arranged in another layer other than the layer where the first common voltage signal line 05 and the second common voltage signal line 13 are arranged. In the peripheral area, the connection pattern 12 is connected to the first common voltage signal line 05 through a plurality of via holes 15; and in the display area, the connection pattern 12 is connected to the second common voltage signal line 13 through a plurality of via holes 15.

In the case that the common voltage signal is transmitted through the connection pattern 12, as shown in FIG. 6, the orthographic projection of the connection pattern 12 onto the second base substrate does not overlap the orthographic projection of the data line 11 onto the second base substrate, so as to reduce the coupling of the common voltage signal to the data signal on the data line 11. The connection pattern 12 may be of a comb shape, the comb handle of the connection pattern 12 is located in the peripheral area, and the comb teeth of the connection pattern 12 is located in the display area. It should be noted that, the connection pattern may have other shapes, for example, the connection pattern 12 has an elongated shape, and the line width of the connection pattern 12 in the peripheral area and the line width of the connection pattern 12 in the display area are substantially the same.

In the above embodiments, an embedded UDC can be implemented without changing the frame and size of the display panel. In the embodiment, it is possible to implement the UDC region S4 with a high transmittance and ensure that the UDC can collect sufficient light. In addition, the area of the UDC region S4 is large in each of the medium-sized display product and the large-sized display product; in this regard, in order to ensure a high transmittance, no spacer is arranged in the UDC region, which may adversely affect the uniformity of the thickness of the cell in the UDC region, and a yellowing phenomenon may occur in the UDC region. In the embodiment, at least one spacer ring is arranged in the transition area surrounding the UDC region S4, so as to ensure the uniformity of the thickness of the cell in the UDC region, and avoid the yellowing phenomenon caused by the uneven thickness of the cell in the UDC region. As a result, the arrangement of the UDC in each of the medium-sized display product and the large-sized display product may be implemented.

The embodiments of the present disclosure provide a display device including a display panel as described above.

The display device includes, but is not limited to: a radio frequency unit, a network module, an audio output unit, an input unit, a sensor, a display unit, a user input unit, an interface unit, a memory, a processor, and a power supply, etc. It will be appreciated by those skilled in the art that the structure of the above display device does not constitute a limitation on the display device, and the display device may include more components or fewer components, or combine some components, or have different component arrangements. In the embodiments of the present disclosure, the display device includes, but is not limited to, a monitor, a mobile phone, a tablet computer, a television, wearable electronic equipment, navigation display equipment, etc.

The display device can be any product or component with a display function, such as a liquid crystal display television, a liquid crystal display, a digital photo frame, a mobile phone, a tablet computer, etc. The display device further includes a flexible printed circuit board, a printed circuit board, and a backplane.

As shown in FIGS. 7-10, the display device further includes a polarizer 10 attached to a surface of the display panel 1. In order to ensure the high transmittance of the UDC region S4, the orthographic projection of the polarizer 10 onto the display panel 1 does not overlap the UDC region S4.

Figure 7:
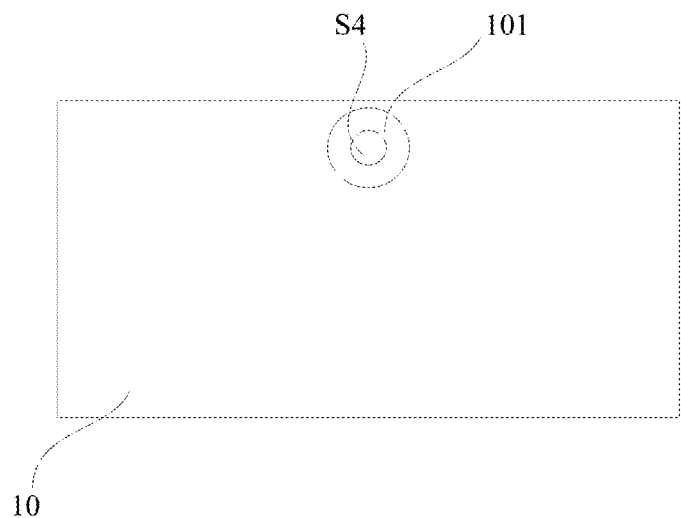
FIG. 7 is a schematic view of a polarizer according to an embodiment of the present disclosure.

In an embodiment, as shown in FIG. 7, the polarizer 10 includes an aperture 101, a first boundary of the orthographic projection of the aperture 101 onto the display panel 1 surrounds the UDC region S4. The shape of the aperture 101 matches the shape of the UDC region S4; for example, when the UDC region S4 is circular, the aperture 101 is circular; when the UDC region S4 is rectangular, the aperture 101 is rectangular. The size of the aperture 101 should be greater than that of the UDC region S4; when the UDC region S4 and the aperture 101 are circular, the radius of the aperture 101 should be greater than the radius of the UDC region S4+the dimensional accuracy of the polarizer+the fitting accuracy of the device; in some embodiments, the minimum distance between the first boundary and the second boundary of the UDC region may be greater than 2 μm.

Figure 8:
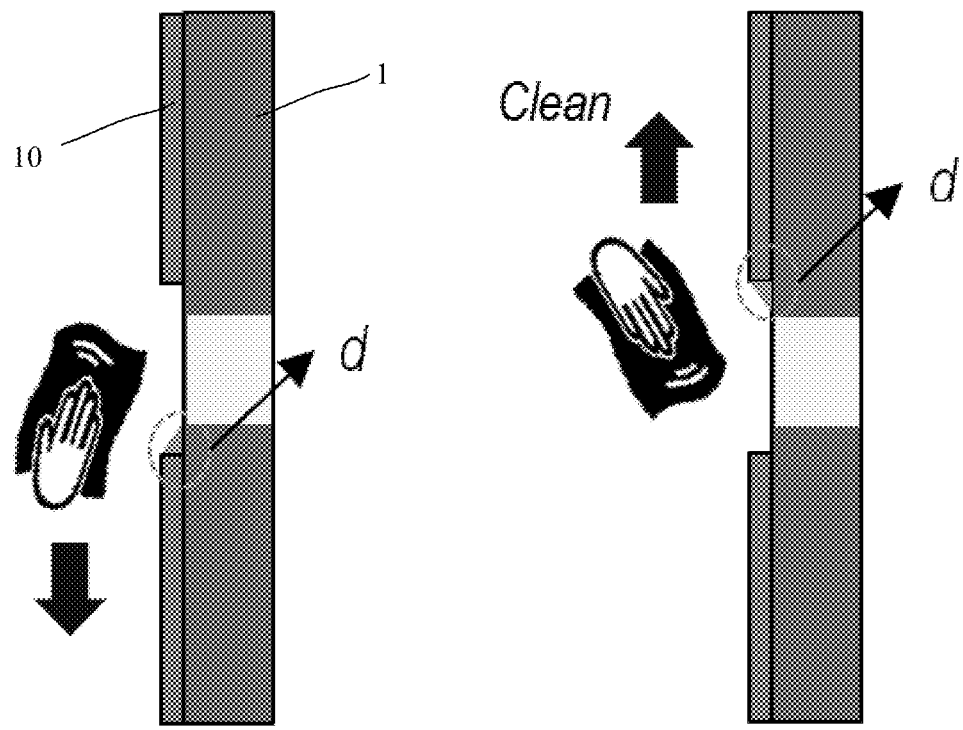
FIG. 8 is a schematic view of wiping the display device provided with the polarizer shown in FIG. 7.
Figure 9:
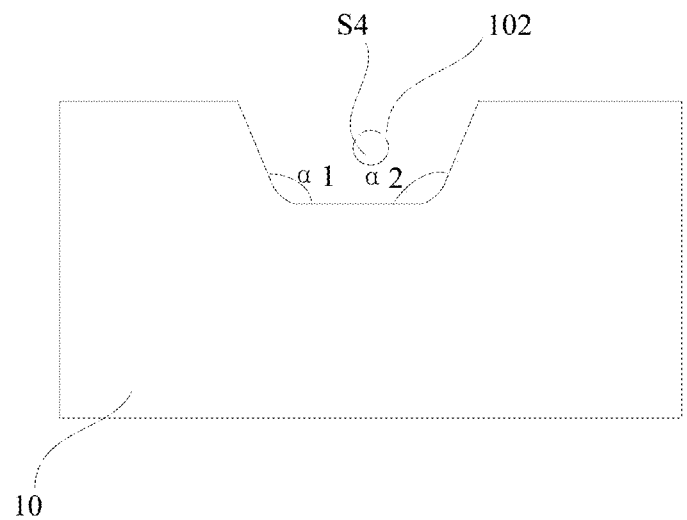
FIG. 9 is a schematic view of the polarizer according to another embodiment of the present disclosure.
Figure 10:
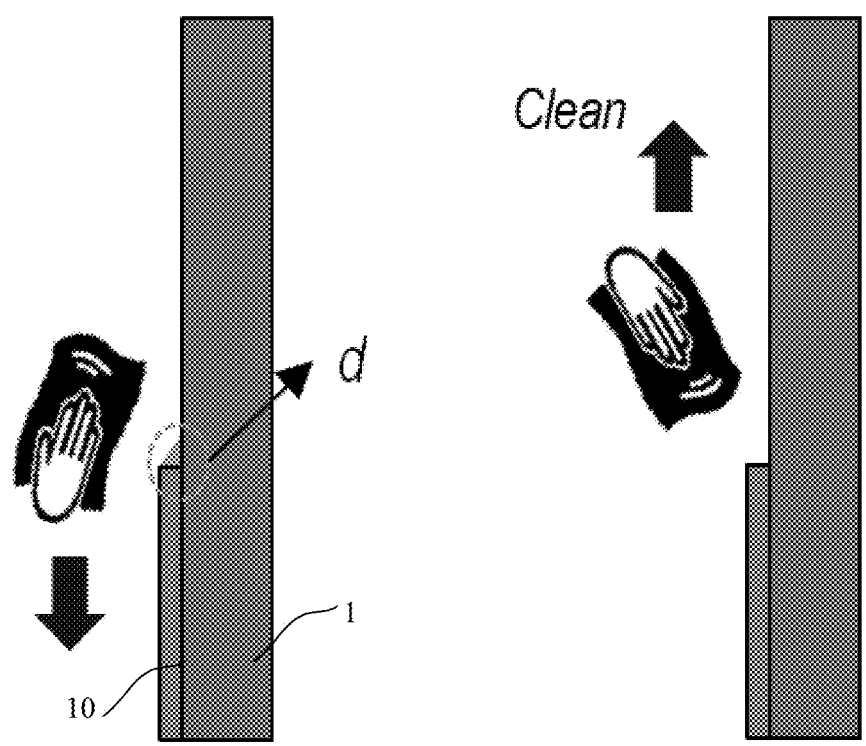
FIG. 10 is a schematic view of wiping a display device provided with the polarizer shown in FIG. 9.

When wiping the display panel provided with the polarizer shown in FIG. 7, dust is easily accumulated at the position d as shown in FIG. 8, and it is difficult to clean the dust at the position d. In order to solve this problem, as shown in FIG. 9, in some embodiments, the edge of the polarizer 10 includes an indentation 102, the boundary of the orthographic projection of the indentation 102 onto the display panel surrounds the UDC region S4, and when wiping the display panel provided with the polarizer shown in FIG. 9, dust can be easily removed from the UDC region S4 as shown in FIG. 10. The shape of the indentation 102 is not limited. In some embodiments, the indentation 102 may be trapezoidal, the polarizer 10 adopts an inverted trapezoidal opening to form the indentation 102, the size of the indentation 102 should be greater than that of the UDC region S4+the dimensional accuracy of the polarizer+the fitting accuracy of the equipment, the two angles α1 and α2 of the indentation 102 may have rounded corners, the angle may be in the range from 90° to 150°, and the radius of the rounded corners may be in the range from 0.5 μm to 2.5 μm.

In the embodiments, it is possible to implement the UDC region S4 with high transmittance and enable the UDC to collect sufficient light.

It should be noted that the various embodiments described herein are described in a progressive manner regarding the same or similar parts throughout the various embodiments, with each embodiment focusing on differences from other embodiments. In particular, the method embodiments are described more simply because they are substantially similar to the product embodiments, and for the relevant portion of the method embodiments, it may refer to that of the product embodiments.

Unless otherwise defined, technical terms or scientific terms used in the present disclosure shall have their ordinary meanings as understood by those with ordinary skills in the art to which the present disclosure belongs. The words "first", "second" and the like used in the present disclosure do not indicate any orders, quantities, or importance, but are only used to distinguish different components. Similar words such as "including" or "containing" mean that the elements or objects appearing before the word cover the elements or objects listed after the word and their equivalents, without excluding other elements or objects. Similar words such as "connected" or "connecting" are not limited to a physical or mechanical connection, but can include electrical connection, whether direct or indirect. The terms "upper", "lower", "left", "right" and the like are used only to indicate relative positional relationships. When the absolute position of the described object changes, the relative positional relationship may also change correspondingly.

It will be understood that when an element such as a layer, film, area, or substrate is referred to as being "on" or "under" another element, it can be "directly on" or "directly under" the other element or an intervening element may be present therebetween.

In the above description, particular features, structures, materials, or characteristics may be combined in any suitable manner in any one or more embodiments or examples.

The above are only the specific embodiments of the present disclosure, but the protection scope of the present disclosure is not limited thereto. Any person skilled in the art can easily think of changes or substitutions within the technical scope disclosed in the present disclosure, which should also be covered by the protection scope of the present disclosure. Therefore, the protection scope of the present disclosure should be defined by the claims.

What is claimed is:

1. A display panel, comprising a display area and a peripheral area located at a periphery of the display area, wherein the peripheral area comprises a package region and an Under Display Camera (UDC) region, the UDC region is located between the display area and the package region, wherein the display panel further comprises a transition area, an opposite substrate and an array substrate, the transition area surrounds the UDC region, and the opposite substrate and the array substrate are arranged opposite to each other,
   in the UDC region, the opposite substrate and the array substrate are both light-transmissible areas;
   in the transition area, at least one spacer ring surrounding the UDC region is arranged on the opposite substrate, and each of the at least one spacer ring comprises a plurality of spacers that are spaced apart from each other,
   wherein in the peripheral area, the array substrate comprises a second base substrate and a driving circuit located on the second base substrate, the driving circuit is located out of the UDC region, and the driving circuit comprises at least one of: a power supply voltage signal line, a first common voltage signal line, a grounding signal line, and a static-electricity-discharging circuit array.

2. The display panel according to claim 1, wherein the transition area comprises a first transition region that is immediately adjacent to the UDC region and surrounds the UDC region; in the first transition region, the opposite substrate comprises a first base substrate, a black matrix located on the first base substrate, and at least one first spacer ring located on a side of the black matrix distal to the first base substrate;

each of the at least one first spacer ring comprises a plurality of first spacers that are spaced apart from each other, and the first spacers are arranged around the UDC region.

3. The display panel according to claim 2, wherein the transition area further comprises a second transition region that is located on a side of the first transition region distal to the UDC region and surrounds the UDC region; in the second transition region, the opposite substrate comprises a first base substrate, a black matrix located on the first base substrate, a color filter pattern located on a side of the black matrix distal to the first base substrate, and at least one second spacer ring located on a side of the color filter pattern distal to the first base substrate;

each of the at least one second spacer ring comprises a plurality of second spacers that are spaced apart from each other, and the second spacers are arranged around the UDC region.

4. The display panel according to claim 3, wherein a height of the first spacer is greater than a height of the second spacer.

5. The display panel according to claim 4, wherein a height difference between the first spacer and the second spacer is 0.4-0.5 μm.

6. The display panel according to claim 3, wherein a minimum distance between an end of the second spacer distal to the first base substrate and the array substrate is smaller than a minimum distance between an end of the first spacer distal to the first base substrate and the array substrate.

7. The display panel according to claim 1, wherein a distance between two adjacent spacers in each of the at least one spacer ring is 6-7 μm.

8. The display panel according to claim 1, wherein the driving circuit comprises the static-electricity-discharging circuit array, and an extension direction of a boundary of the static-electricity-discharging circuit array adjacent to the UDC region is same as or approximately same as an extension direction of a boundary of the UDC region adjacent to the static-electricity-discharging circuit array.

9. The display panel according to claim 1, wherein the driving circuit comprises the first common voltage signal line, the display panel further comprises a second common voltage signal line located in the display area, and the display panel further comprises:

a connection pattern, wherein the connection pattern is connected to the first common voltage signal line through a plurality of connection points, and connected to the second common voltage signal line through a plurality of connection points.

10. The display panel according to claim 9, wherein the display panel further comprises a data line located in the display area, and an orthographic projection of the connection pattern onto the second base substrate does not overlap an orthographic projection of the data line onto the second base substrate.

11. A display device, comprising the display panel according to claim 1.

12. The display device according to claim 11, wherein the display device further comprises a polarizer attached to a surface of the display panel, and an orthographic projection of the polarizer onto the display panel does not overlap the UDC region.

13. The display device according to claim 12, wherein the polarizer comprises an aperture, and a first boundary of an orthographic projection of the aperture onto the display panel surrounds the UDC region.

14. The display device according to claim 13, wherein a minimum distance between the first boundary and a second boundary of the UDC region is greater than 2 μm.

15. The display device according to claim 12, wherein an edge of the polarizer comprises an indentation, a boundary of an orthographic projection of the indentation onto the display panel surrounds the UDC region.

16. The display device according to claim 15, wherein the indentation is of a trapezium.

17. The display device according to claim 11, wherein the transition area comprises a first transition region that is immediately adjacent to the UDC region and surrounds the UDC region; in the first transition region, the opposite substrate comprises a first base substrate, a black matrix located on the first base substrate, and at least one first spacer ring located on a side of the black matrix distal to the first base substrate;

each of the at least one first spacer ring comprises a plurality of first spacers that are spaced apart from each other, and the first spacers are arranged around the UDC region.

18. The display device according to claim 17, wherein the transition area further comprises a second transition region that is located on a side of the first transition region distal to the UDC region and surrounds the UDC region; in the second transition region, the opposite substrate comprises a first base substrate, a black matrix located on the first base substrate, a color filter pattern located on a side of the black matrix distal to the first base substrate, and at least one second spacer ring located on a side of the color filter pattern distal to the first base substrate;

each of the at least one second spacer ring comprises a plurality of second spacers that are spaced apart from each other, and the second spacers are arranged around the UDC region.

19. The display device according to claim 18, wherein a height of the first spacer is greater than a height of the second spacer.

\* \* \* \* \*